United States Patent

Muller et al.

[11] Patent Number: 6,134,109
[45] Date of Patent: Oct. 17, 2000

[54] CONTROL BOX WITH DOOR AND COOLER

[75] Inventors: Norbert Muller, Dietzholztal; Heinrich Strackbein, Bieberteil; Jurgen Bernhardt, Haiger-Rodenbach; Walter Nicolai, Buseck, all of Germany

[73] Assignee: Rittal-Werk Loh GmbH & Co. KG, Herborn, Germany

[21] Appl. No.: 09/142,633

[22] PCT Filed: Feb. 13, 1997

[86] PCT No.: PCT/EP97/00658

§ 371 Date: Sep. 8, 1998

§ 102(e) Date: Sep. 8, 1998

[87] PCT Pub. No.: WO97/34455

PCT Pub. Date: Sep. 18, 1997

[30] Foreign Application Priority Data

Mar. 13, 1996 [DE] Germany .......................... 196 09 794

[51] Int. Cl.[7] .................................... H05K 7/20
[52] U.S. Cl. .......................... 361/700; 361/687; 361/695; 361/714; 165/104.33; 62/259.1; 454/189
[58] Field of Search .................................... 361/687, 700, 361/714, 696, 701, 796, 831, 692–694, 724, 683, 690–695, 697, 702–704; 165/122, 104.33, 104.34, 185, 53, 54; 62/259.1, 263, 448, 259.2; 454/184, 236, 251, 253; 49/478, 380

[56] References Cited

U.S. PATENT DOCUMENTS

| 3,559,728 | 2/1971 | Lyman ..................................... 165/122 |
| 3,871,188 | 3/1975 | Vold et al. ............................... 62/298 |
| 4,013,120 | 3/1977 | Rheinheimer ............................. 165/48 |
| 4,424,684 | 1/1984 | Waldschmidt et al. ................... 62/239 |
| 4,475,358 | 10/1984 | Seifert et al. ............................. 62/186 |
| 5,036,677 | 8/1991 | Neuenfeldt et al. ................... 62/259.1 |
| 5,187,950 | 2/1993 | Weldon ..................................... 62/449 |
| 5,467,250 | 11/1995 | Howard et al. .......................... 361/696 |
| 5,657,641 | 8/1997 | Cunningham et al. ................... 62/263 |

FOREIGN PATENT DOCUMENTS

| 70.05704 | 12/1971 | France . |
| 003815619A1 | 5/1988 | Germany ......................... H05K 7/20 |
| 2 277 767 | 5/1993 | United Kingdom . |

*Primary Examiner*—Leo P. Picard
*Assistant Examiner*—Michael Datskovsky
*Attorney, Agent, or Firm*—Jansson, Shupe, Bridge & Munger, Ltd

[57] ABSTRACT

The invention relates to a control box with a box body which can be closed off by a door and a cooler with an inner circuit consisting of a ventilator and an evaporator, and an outer circuit consisting of a compressor, a condenser and a ventilator. An air-conditioning door which can easily by used for both types of operation is provided by a novel casing construction and an appropriate distribution of the modules of the inner and outer circuits of the cooler.

8 Claims, 2 Drawing Sheets

CONTROL BOX WITH DOOR AND COOLER

RELATED APPLICATION AND CLAIM OF PRIORITY

This application is a continuation of PCT Application No. PCT/EP97/00658 having an international filing date of Feb. 13, 1997, which designates at least one country in addition to the United States and which claims priority from German Application No. 196 09 794 filed Mar. 13 1996. For priority purposes, this application claims the benefit of 35 USC 371 and/or 35 USC 120.

FIELD OF THE INVENTION

The invention relates to a switch cabinet in general and a switch cabinet employing a cooling device in particular.

BACKGROUND OF THE INVENTION

It is known that a cooling device instead of a wall can be attached to a cabinet body. Such a design of a switch cabinet is known from U.S. Pat. No. 3,559,728. With these types of switch cabinets the cooling device features a tub-shaped housing outer part that is subdivided into two chambers. Each of the chambers receives cooling device components of the cooling circuit. The first chamber makes ambient contact, while the second chamber faces the inner space of the switch cabinet.

A cooling device that is designed as a wall element is known from FR 70 05704. As such, it projects into the inner space and thereby diminishes the volume available for built-in components of the switch cabinet.

OBJECTS OF THE INVENTION

The object of the invention is to provide a switch cabinet that overcomes the shortcomings of the prior art.

Another object of the invention is to provide a switch cabinet having a cooling device capable of being connected to the cabinet body like a cabinet door.

Still another object of the invention is to provide a switch cabinet having a cooling device capable of being connected to the cabinet body as a door having either a left or right hinge. How these and other objects are accomplished will become apparent from the following descriptions and from the drawings.

SUMMARY OF THE INVENTION

The invention involves an improvement to a switch cabinet having a cabinet body that capable of being closed by a cabinet door. Such cooling device includes an inner circuit having a fan and a vaporizer and an outer circuit having a compressor, a condenser and a fan. The cooling device is provided with a tub-shaped outer housing part that connects to, articulates on and closes the cabinet body. Such outer housing is provided with a covering carrier plate such that the space surrounded by the outer housing part and the carrier plate forms an upper and a lower receiving space. The carrier plate features air suction openings in the area of the upper receiving space and an air outlet opening for the lower receiving space.

The improvement involves the cooling device which is designed as a cabinet door, in that the cooling device components of the inner circuit are arranged in the upper receiving space which is open toward the top, fastened to the carrier plate and hermetically covered, while the cooling device components of the outer circuit are arranged in the lower receiving space that is open toward the bottom and connected to the carrier plate. In such an arrangement, fresh air for the outer circuit is drawn through the open lower side of the lower receiving space, over the cooling device components of the outer circuit and into the lower area of the upper receiving space where it is conducted off at the open side of the upper receiving space.

In a preferred embodiment of the invention, the housing outer part practically replaces the cabinet door and, as such, is attached to the cabinet body. In such an embodiment, the carrier plate bears all of the components of the cooling device and is thus capable of being connected to the housing outer part in such a manner so as to allow arrangement of the components of the cooling device independent of the positioning of the cooling device.

As a result of the subdivision of the cooling device into an upper and a lower receiving space and the distribution of the inner and outer circuit components within such spaces, the hermetic covering of the components of the inner circuit creates a definite decoupling of the two circuits thus preventing condensation water from reaching the inside of the cabient body. The design of the cooling device is simple in that the components are all capable of being fastened to the carrier plate.

In one embodiment of the invention, the hermetic covering of the components of the inner circuit is achieved in that the cooling device components of the inner circuit are covered by means of a covering hood that connects to the side of the carrier plate that faces away from the inner space of the cabinet.

In yet another embodiment of the invention, the housing outer part is subdivided by a first and a second separating sheet, such as sheet metal, into a first and a second ventilation chamber. Such housing outer part and ventilation chambers are further subdivided by a separating wall into an upper and lower receiving space. The first and second separating sheets of the ventilation chambers features air inlet perforations in the upper receiving space, and air outlet perforations in the lower receiving space thereby allowing the conduction of air from the outer circuit to take place through both receiving spaces.

In one embodiment, attachment of the carrier plate to the housing outer part is achieved in that the ventilation chambers feature fastening sections parallel to the carrier plate. Such fastening sections are provided with attachment uptakes which allow the carrier plate to be fastened in two positions rotated 180 degrees from each other. The distribution and arrangement of the fastening uptakes thereby takes both types of positioning of the cooling device into consideration. The housing outer part can articulate with the cabinet body in positions rotated by 180 degrees. The carrier plate can always be connected to the housing outer part such that the uptake space with the inner circuit is on top.

According to one of the preferred embodiments of the invention, the housing outer part features a trapezoidally shaped cross section, and the ventilation chambers are subdivided therein include a right angled, triangular shaped cross section. The trapezoidal shape of the housing outer part provides a visually attractive design of the switch cabinet while the ventilation chambers reinforce the housing outer part.

The invention is explained in more detail on the basis of an exemplified embodiment illustrated in the drawings.

DETAILED DESCRIPTION OF PREFERRED EMBODIMENTS

Figure 1:
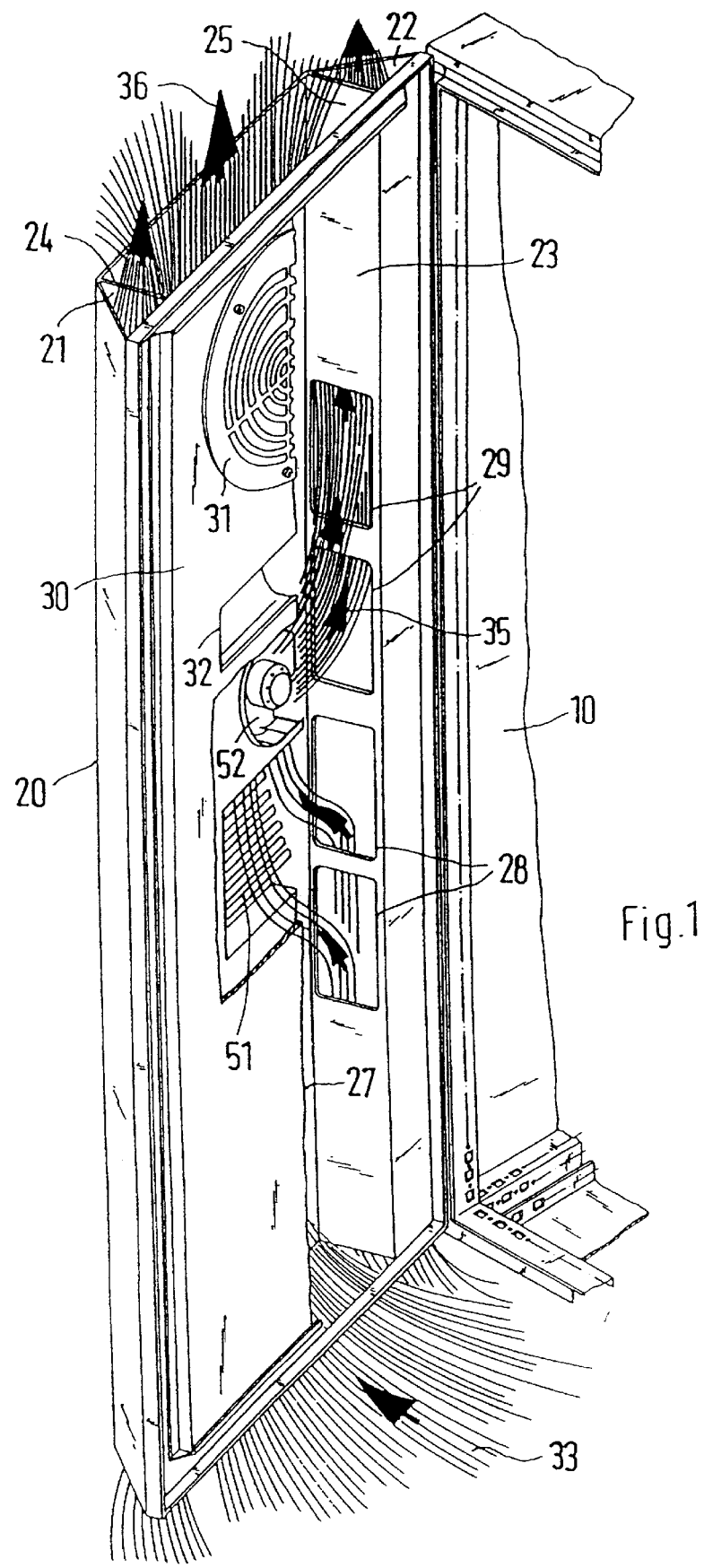
FIG. 1 a perspective view showing a partial section of the switch cabinet with the cooling device articulated on the cabinet body in the open position.

In FIG. 1 only the part of the front side of the cabinet body 10 onto which the cooling device is articulated like a cabinet door is shown. The cooling device features a tub-like housing outer part 20 with a trapezoidally shaped cross section that completes the outer contour of the switch cabinet when in the closed position. The articulation and closing of the housing outer part 20 on the cabinet body takes place in a manner known in and of itself, with known hinge and locking elements. Because such hinge and locking elements are not significant to the present invention, details concerning their construction will not be discussed here. Also, these elements are not illustrated in the drawings.

The open side of the housing outer part 20 that faces the inner space of the switch cabinet is closed off by means of a carrier plate 30. This carrier plate 30, along with the housing outer part 20, includes a space that forms an upper receiving space 25 and a lower receiving space 27. The subdivision is preferably carried out at approximately half the height of the cooling device that is used as a cabinet door.

Figure 2:
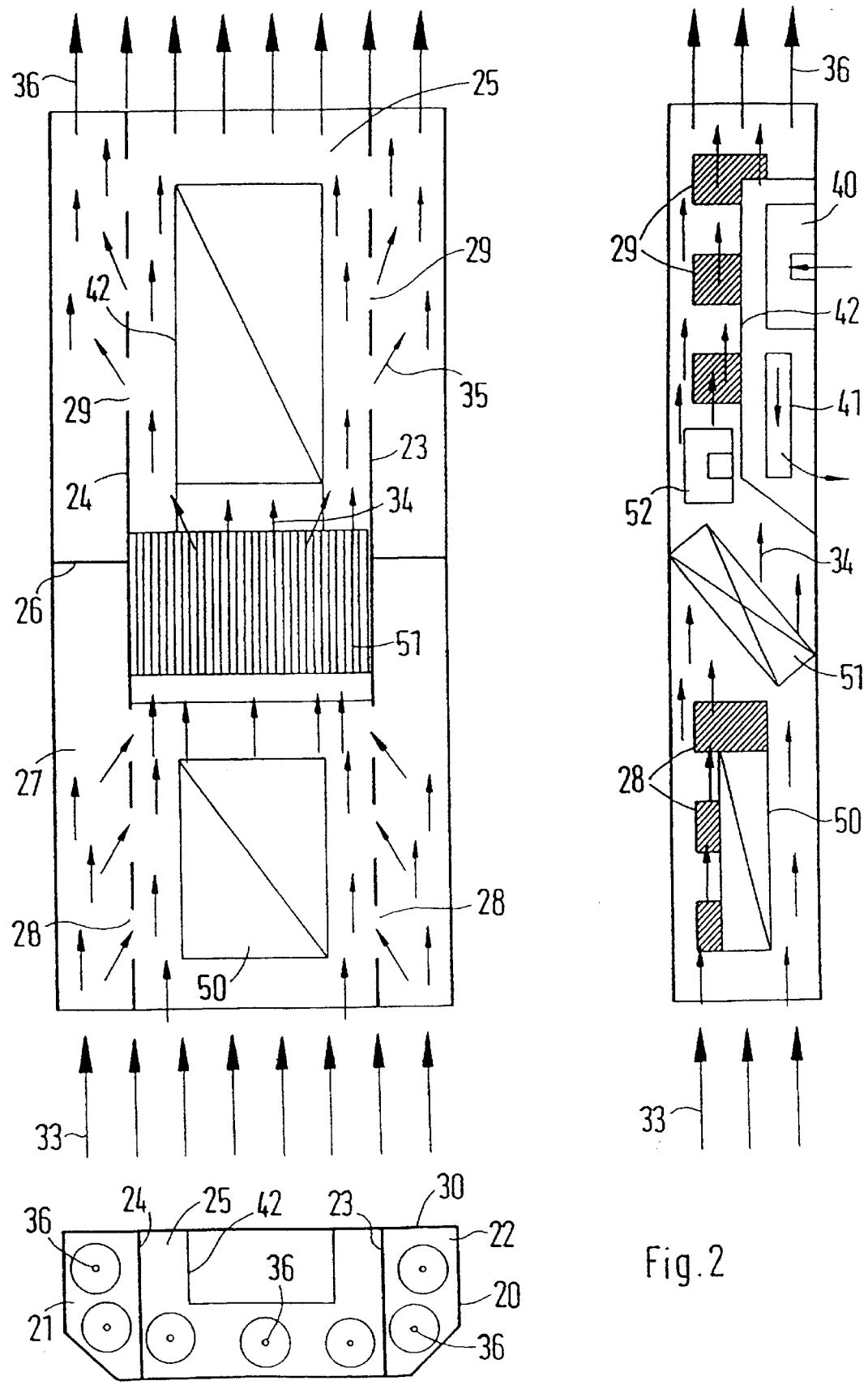
FIG. 2 is a schematic of the plan, top and end views of the cooling device showing the distribution and arrangement of the components of the cooling device.

The upper receiving space 25 is open toward the top, and the lower receiving space 27 is open toward the bottom. The air suction openings 31 and, the air suction openings 32 of the inner circuit are provided in the area of the upper receiving space 25. The components of the inner circuit of the cooling device, a fan 40 and a vaporizer 41 are arranged and fastened on the side of the carrier plate 30 facing away from the inner space of the switch cabinet. These components are hermetically covered with a covering hood 42, as is shown in FIG. 2. Such arrangement allows the warm air to be drawn out of the switch cabinet by means of fan 40, through the air suction opening 31, and led over vaporizer 41 and, when cooled, returned to the switch cabinet through air outlet opening 32.

The components of the outer circuit, a compressor 50, a condenser 51 and a fan 52 are arranged and fastened to the carrier plate 30 in the lower receiving space 27.

The fan 52 of the outer circuit draws fresh air into the lower receiving space 27. Ventilation chambers 21 and 22 are subdivided in the area of the vertical sides of the housing outer part 20 by means of separating sheet metal 23 and 24, said ventilation chambers being appropriately subdivided by means of separating walls 26 to correspond to the upper and lower receiving spaces 25 and 27.

In such an arrangement, the drawn fresh air stream 33 not only extends into the lower receiving space 27, but also into the lower parts of the ventilation chambers 21 and 22. These partial streams enter into the lower receiving space 27 through the air outlet perforations 28. The fresh air flow 33 streams over the components 50, 51 and 52 of the outer circuit in the lower receiving space 27. The fan 52 of the outer circuit leads the fresh air stream into the upper receiving space 25 and into the ventilation chambers 21 and 22 through the air inlet perforations 29, as is shown by arrows 34 and 35. The stream of fresh air exits the upper receiving space 25 and the ventilation chambers 21 and 22 at the open, upper sides, as is shown by the arrows 36. The ventilation chambers 21 and 22 are closed and have a right angled, triangular shape or a pentagonal cross section. Sections of the ventilation chambers 21 and 22 parallel to the carrier plate 30 serve as a fastening surface for the carrier plate 30, whereby gasket elements can be used throughout as intermediate elements. Moreover, the carrier plate 30 allows for free edge areas at the edges of the housing outer part 20, bearing the sealing elements that are required for sealing the cabinet body, or constructed as sealing spacers that act in conjunction with sealing elements on the cabinet body 10.

The attachment surfaces for the carrier plate 30 are provided with fastening uptakes that permit the attachment of the carrier plate 30 to the housing outer part 20 in two positions rotated by 180 degrees. The housing outer part 20 can then be articulated left or right on the open front side of the cabinet body 10. The components 40 and 41 of the inner circuit and the components 50, 51 and 52 of the outer circuit can thereby always be used as shown in FIG. 1.

The progress of the fresh air in the outer circuit is shown, based on FIG. 1, in three sections or views perpendicular to each other. The fan 52 is responsible for drawing fresh air 33 into the lower receiving space 25 and the subdivided lower area of the ventilation chambers 21 and 22. Part of the fresh air, drawn through the ventilation chambers 21 and 22, flows across the air outlet perforation 28 of the separating sheet metals 23 and 24 into the lower receiving spaces 27. After passing the compressor 50 the fresh air is led over the vaporizer 51 and then, once warmed, passes through the remaining space of the upper receiving space 25 not occupied by the covering hood 42, as is shown by arrow 34. A part of the warmed fresh air enters the upper part of the ventilation chambers 21 and 22 through the air inlet perforation 29, as is shown by arrows 34, so that the warmed fresh air can be exhausted on the open upper end of the upper receiving space 25 as well as on the upper end of the ventilation chamber 21 and 22.

While the principles of the invention have been shown and described in connection with but a few embodiments, it is to be understood clearly that such embodiments are by way of example and are not limiting.

What is claimed:

1. In a switch cabinet comprised of a cabinet body that includes a cabinet door and a cooling device having an inner circuit that includes a fan and a vaporizer and an outer circuit that includes a compressor, a condenser and a fan, wherein said cooling device is enclosed by a tub-shaped outer housing articulated on the cabinet body, and a carrier plate such that the space surrounded by the outer housing part and the carrier plate forms an upper receiving space and a lower receiving space and said carrier plate has at least one air suction opening in the upper receiving space area and an air outlet opening for the inner circuit, the improvement comprised of:

the cooling device serving as the cabinet door;
   the components of the inner circuit being located in the upper receiving space and fastened to the carrier plate, said components being hermetically enclosed;
   the upper receiving space having an open top;
   the cooling device components of the outer circuit located in the lower receiving space and connected to the carrier plate; and
   the lower receiving space having an opening at its bottom, whereby fresh air for the outer circuit is drawn through the bottom of the lower receiving space over the cooling device components and into the upper receiving space where it is discharged through the top of the upper receiving space.

2. The switch cabinet of claim 1 wherein:
   the carrier plate has a first side facing away from the switch cabinet and a second side that faces toward the switch cabinet;

the cooling device components of the inner circuit are covered with a covering hood; and the covering hood is connected to the first side of the carrier plate.

3. The switch cabinet of claim 1 wherein:

a first separating sheet and a second separating sheet divide the outer housing part into a first and a second ventilation chamber;

separating wall further subdivides the housing outer part and the first and the second ventilation chambers into an upper and a lower receiving spaces; and the first and the second separating sheets of the first and second ventilation chambers includes air inlet perforations in the upper receiving space and air outlet perforations in the lower receiving space.

4. The switch cabinet according to claim 3 wherein;

the first and the second ventilation chambers include fastening sections parallel to the carrier plate;

the fastening sections include fastening uptakes; and the carrier plate is secured to the fastening sections of the ventilation chambers by use of the fastening uptakes.

5. The switch cabinet of claim 3 wherein:

the outer housing part has a trapezoidal cross section; and the first and the second ventilation chambers have a right angled triangular shaped cross section.

6. The switch cabinet of claim 1 wherein the condenser of the outer circuit is located between the upper receiving space and the lower receiving space.

7. The switch cabinet of claim 3 wherein the separating wall in the first and second ventilation chambers is located in the area of the condenser of the outer circuit.

8. The switch cabinet of claim 1 wherein:

the fan of the outer circuit is located directly over the condenser of the outer circuit; and the air inlet perforation in the separating sheets of the first and the second ventilation chambers is located above the fan of the outer circuit.

* * * * *